United States Patent
Iwata et al.

(10) Patent No.: US 6,590,474 B2
(45) Date of Patent: Jul. 8, 2003

(54) MULTILAYER PIEZOELECTRIC FILTER WITH AN AIR VENT BETWEEN TWO RESONATOR CHAMBERS

(75) Inventors: Tatsuo Iwata, Mie (JP); Kazuhiro Hayashi, Mie (JP); Masayuki Watanabe, Nagoya (JP)

(73) Assignee: NGK Spark Plug Co., Ltd., Aichi (JP)

(*) Notice: Subject to any disclaimer, the term of this patent is extended or adjusted under 35 U.S.C. 154(b) by 0 days.

(21) Appl. No.: 09/941,739

(22) Filed: Aug. 30, 2001

(65) Prior Publication Data

US 2002/0024408 A1 Feb. 28, 2002

(30) Foreign Application Priority Data

Aug. 31, 2000 (JP) ........................ 2000-264101

(51) Int. Cl.⁷ .............................. H03H 9/58; H03H 9/08
(52) U.S. Cl. .................. 333/189; 333/187; 310/342; 310/346
(58) Field of Search ............................ 333/186–192; 310/341, 346, 342

(56) References Cited

U.S. PATENT DOCUMENTS 6,225,877 B1 * 5/2001 Ozeki et al. ............... 333/189

FOREIGN PATENT DOCUMENTS

| JP | 3-973714 | * | 4/1991 | ........... 333/191 |
| JP | 4-4603 | * | 1/1992 | ........... 333/191 |
| JP | 6-224687 | * | 8/1994 | ........... 333/190 |
| JP | 9-18285 | * | 1/1997 | |
| JP | 2000-77971 | * | 3/2000 | |
| JP | 2000-183687 | | 6/2000 | |
| JP | 2000-223982 | | 8/2000 | |
| JP | 2000-223983 | | 8/2000 | |

* cited by examiner

Primary Examiner—Barbara Summons
(74) Attorney, Agent, or Firm—Sughrue Mion, PLLC

(57) ABSTRACT

A multilayer type piezoelectric filter is provided which includes at least two chambers for receiving therewithin resonators, respectively. The chambers are partly defined by a top printed circuit board and an intermediate printed circuit board. The top printed circuit board and the intermediate printed circuit board are formed with communication holes for communicating the chambers with the outside.

12 Claims, 4 Drawing Sheets

MULTILAYER PIEZOELECTRIC FILTER WITH AN AIR VENT BETWEEN TWO RESONATOR CHAMBERS

BACKGROUND OF THE INVENTION

The present invention relates to a multilayer type piezoelectric filter which is suited for a wave filter circuit in a mobile radio communication device such as a portable radio communication device and an automotive telephone.

This kind of piezoelectric filter consists of a plurality of unit filter circuits, each including a series resonator and a parallel resonator which are connected to constitute an L-connection. The unit filter circuits are laminated one upon the other and disposed between an input terminal and an output terminal or a grounding terminal. The resonance frequency of the series resonators and the antiresonance frequency of the parallel resonators are adapted to correspond with each other, and the difference between the antiresonance frequency of the series resonators and the resonance frequency of the parallel resonators is held constant.

In the conventional structure of the piezoelectric filter, resonators and terminal boards are generally laminated to form a multilayer structure and disposed within a casing. This structure encounters a problem that it requires a large number of constituent parts and a difficult assembling work. On the other hand, for downsizing of a mobile radio communication device, the piezoelectric filter is required to be as thin as possible and as small in size as possible. Further, it is required that an electrical connection between each piezoelectric filter and an electrical path on a resonator mounting surface be attained with ease and the resonators be protected electrically and mechanically. To meet this requirement, it has been proposed a multilayer type piezoelectric filter wherein at least two resonators surrounded by frame-like spacers are laminated with an intermediate printed circuit board being interposed therebetween, a chamber is provided within each frame-like spacer for receiving therewithin a resonator, a top printed circuit board is disposed at the uppermost position, a bottom printed circuit board is disposed at the lowermost position, and electrode pads for connection to a printed circuit board on which the piezoelectric filter is to be mounted is formed on the lower surface of the bottom printed circuit board, whereby to form a predetermined filter circuit.

With such a structure, the piezoelectric filter is formed from plate-like elements or components which are laminated one upon the other. The piezoelectric filter can be simple in structure and compact in size. Further, the resonators are protected by the frame-like spacers and the top and bottom printed circuit boards. Thus, the piezoelectric filter has an advantage that it is strong and durable and the resonators are protected electrically and mechanically.

SUMMARY OF THE INVENTION

In the meantime, in the above described multilayer type piezoelectric filter, reflow soldering is performed when the electrode pads at the lower surface of the piezoelectric filter are electrically and mechanically connected to a predetermined electrical path on a printed circuit board on which the piezoelectric filter is to be mounted. In this instance, the lower portion of the piezoelectric filter is exposed to heat of a high temperature. Further, the frame-like spacers and the printed circuit boards are bonded together by adhesive sheets which need to be heated. Thus, the piezoelectric filter is exposed to heat of a high temperature at the time of heating of the adhesive sheets. In case the piezoelectric filter is held within an atmosphere of a high temperature, the internal pressure becomes higher since the chambers defined within the frame-like spacers and receiving therewithin the resonators are hermetically sealed. Furthermore, if there is a little water within the chambers, it is vaporized to increase the internal pressure further. By this, there is caused a problem that the top printed circuit board and the bottom printed circuit board are curved or rounded outside and therefore the outer casing constituted by those printed circuit boards is deformed or transformed.

It is accordingly an object of the present invention to provide a multilayer type piezoelectric filter which is assuredly prevented from deformation even when it is heated to a high temperature and which is strong and durable so as to maintain stable characteristics for a long period of usage.

To accomplish the above object, there is provided according to an aspect of the present invention a multilayer type piezoelectric filter comprising at least two laminated resonators, at least two frame-like spacers surrounding the resonators, respectively, at least one intermediate printed circuit board interposed between the resonators and between the frame-like spacers, a top printed circuit board disposed on the resonators and the frame-like spacers to cooperate with one of the frame-like spacers and the intermediate printed circuit board to define therebetween a first chamber within which one of the resonators is disposed, a bottom printed circuit board disposed under the resonators and the frame-like spacers to cooperate with the other of the frame-like resonators and the intermediate printed circuit board to define therebetween a second chamber within which the other of the resonators is disposed, a plurality of electrode pads formed on a lower surface of the bottom printed circuit board, a first communication hole formed in the intermediate printed circuit board for providing communication between the first chamber and the second chamber, and a second communication hole formed in the top printed circuit board for providing communication between the first chamber and the outside.

According to another aspect of the present invention, there is provided a multilayer type piezoelectric filter comprising a plurality of resonators laminated one upon the other, a plurality of frame-like spacers surrounding the resonators, respectively, a plurality of intermediate printed circuit boards interposed between adjacent two of the resonators and between adjacent two of the frame-like spacers, a top printed circuit board disposed on the resonators and the frame-like spacers to cooperate with associated one of the frame-like spacers and associated one of the intermediate printed circuit boards to define therebetween a first chamber, the intermediate printed circuit boards cooperating with the frame-like spacers to define therebetween at least one second chamber, a bottom printed circuit board disposed under the resonators and the frame-like spacers to cooperate with associated one of the frame-like spacers and associated one of the intermediate printed circuit boards to define therebetween a third chamber, the resonators being disposed within the first chamber, the second chamber and the third chamber, respectively, the frame-like spacers, the top printed circuit board and the bottom printed circuit board being bonded together and hermetically sealed at joining portions thereof, a plurality of electrode pads formed on a lower surface of the bottom printed circuit board, a plurality of first vents formed in the intermediate printed circuit boards for providing communication between the first chamber and the second chamber and between the second chamber and the third chamber, and a second vent formed in the top printed circuit board for providing communication between the first chamber and the outside.

DESCRIPTION OF THE PREFERRED EMBODIMENT

Figure 1:
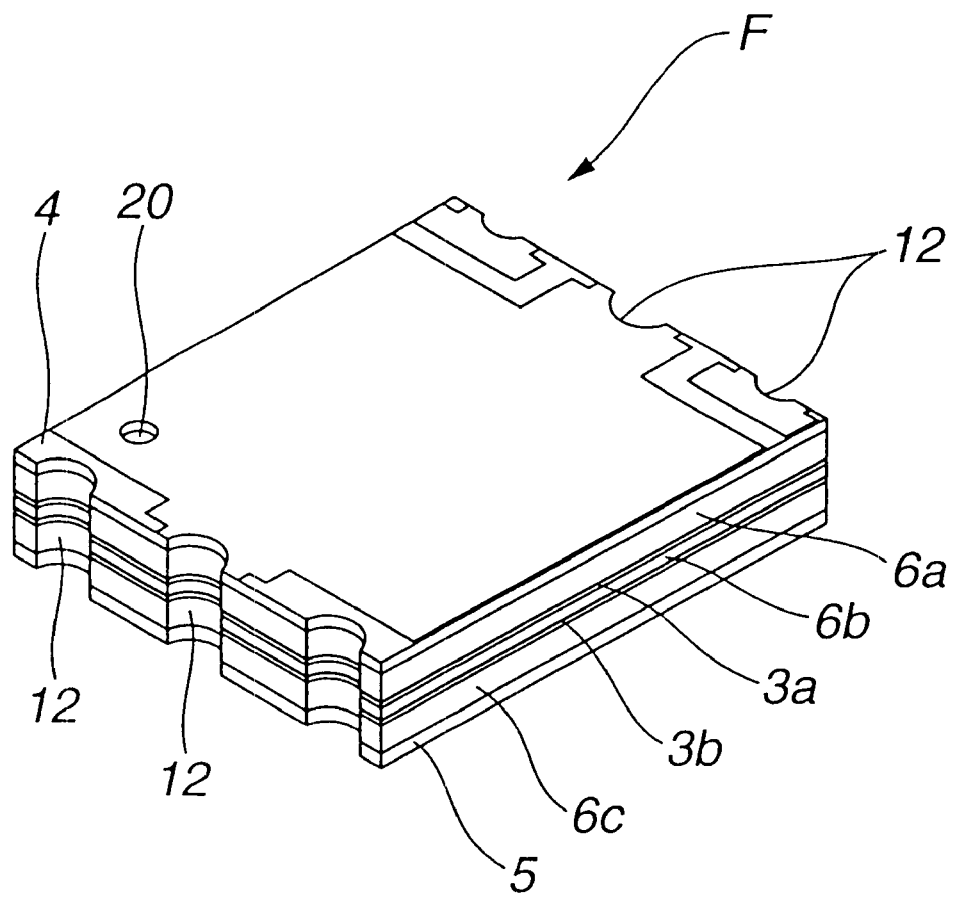
FIG. 1 is a perspective view of a multilayer type piezoelectric filter according to an embodiment of the present invention.
Figure 2:
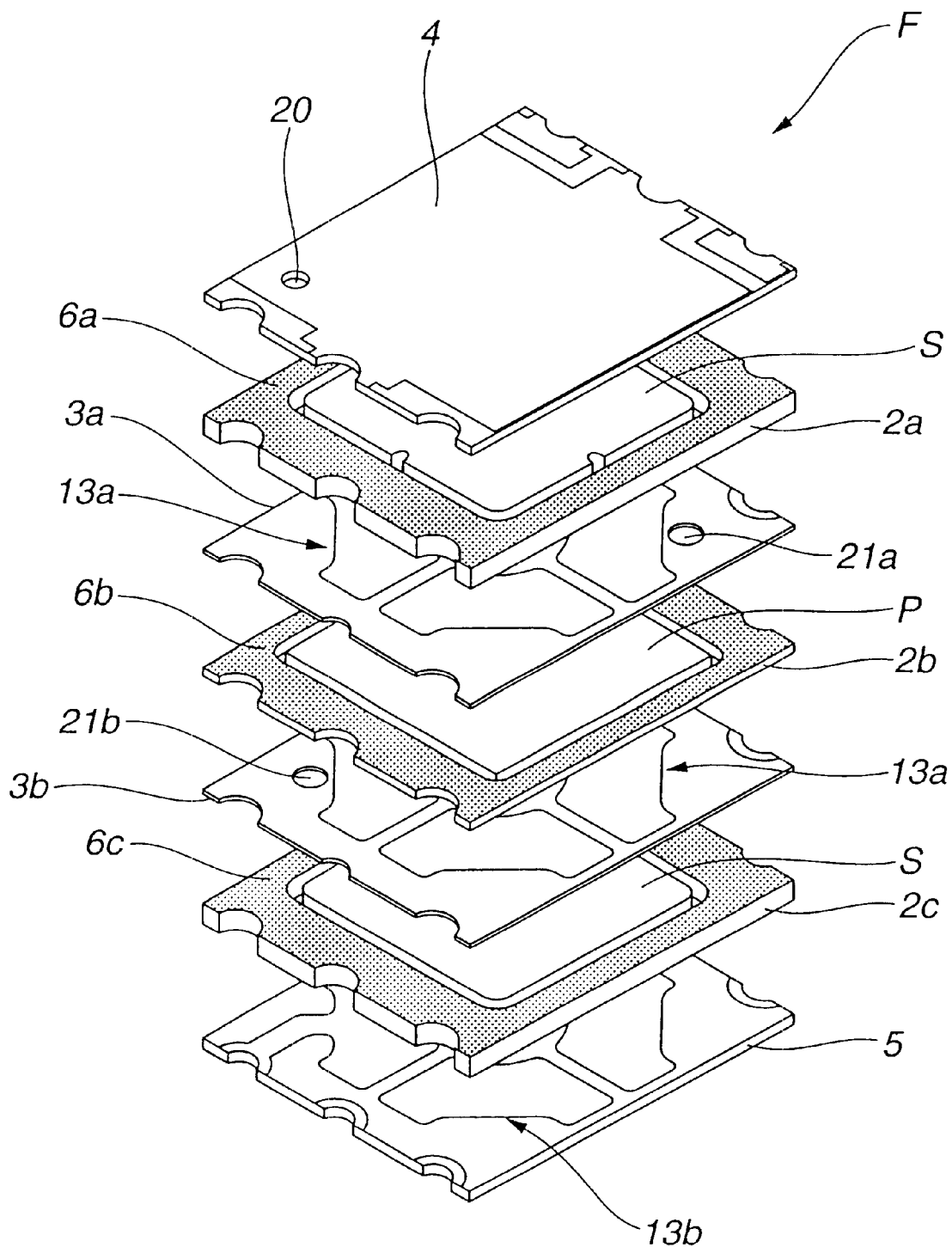
FIG. 2 is an exploded perspective view of the multilayer type piezoelectric filter of FIG. 1.

Referring first to FIGS. 1 and 2, a multilayer type piezoelectric filter according to an embodiment of the present invention is generally indicated by F and of the type having an S-P-S (series-parallel-series) structure. The piezoelectric filter F includes a series resonator S, a parallel resonator P and a series resonator S which are surrounded by respective frame-like spacers 2a, 2b and 2c and laminated one upon another with intermediate printed circuit boards 3a and 3b being interposed therebetween. A top printed circuit board 4 and a bottom printed circuit board 5 are disposed on the top of and under the bottom of the thus laminated resonators S, P and S. The frame-like spacers 2a, 2b and 2c and the printed circuit boards 4 and 5 are bonded together by means of adhesive sheets (not shown) and therefore hermetically sealed at the joining portions thereof. Each adhesive sheet is made of thermosetting resin and has a rectangular frame-like shape. The adhesive sheets are interposed between components, i.e., between the top printed circuit board 4 and the intermediate printed circuit board 3a, between the intermediate printed circuit boards 3a and 3b and between the intermediate printed circuit board 3b and the bottom printed circuit board 5 in a way as to extend along the peripheries thereof and bond or join them together by heating. The frame-like spacers 2a, 2b and 2c cooperate with the top printed circuit board 4, the intermediate printed circuit boards 3a and 3b and the bottom printed circuit board 5 to define therebetween chambers 6a, 6b and 6c for receiving therewithin the series resonator S, parallel resonator P and series resonator S, respectively. The resonators S, P and S are supported at the upper and lower surfaces thereof on the associated components, i.e., on the top printed circuit board 4 and the intermediate printed circuit board 3a, on the intermediate printed circuit boards 3a and 3b, and on the intermediate printed circuit board 3b and the bottom printed circuit board 5, respectively.

In this connection, each of the resonators S, S and P is made of lead titanate zirconate and has a square, thin plate-like shape. Each resonator consists of a piezoelectric ceramic substrate (no numeral) of a predetermined thickness and electrodes (not shown) formed on the upper and lower surfaces of the piezoelectric ceramic substrate. The parallel resonator P is thinner as compared with the series resonators S and S so as to have a large electrostatic capacity. By making smaller the thickness of the parallel resonator P as compared with that of the series resonators S, the difference in the capacity therebetween becomes large, thus making it possible to increase the attenuation or damping amount.

As shown in FIG. 2, each of the frame-like spacers 2a, 2b and 2c has at the front and rear edges thereof arcuate conductive grooves (no numeral) which are respectively aligned with conductive grooves (no numeral) at the edges of the intermediate printed circuit boards 3a and 3b, the top printed circuit board 4 and the bottom printed circuit board 5. By this, a plurality of vertical conductive paths 12 (refer to FIG. 1) are formed by the conductive grooves.

Then, the electric connection of the electrodes on the upper and lower surfaces of each of the resonators S, P and S by way of the conductive paths on the upper and lower surfaces of each of the intermediate printed circuit boards 3a and 3b, the top printed circuit board 4 and the bottom printed circuit board 5 will be described hereinafter.

Figure 3:
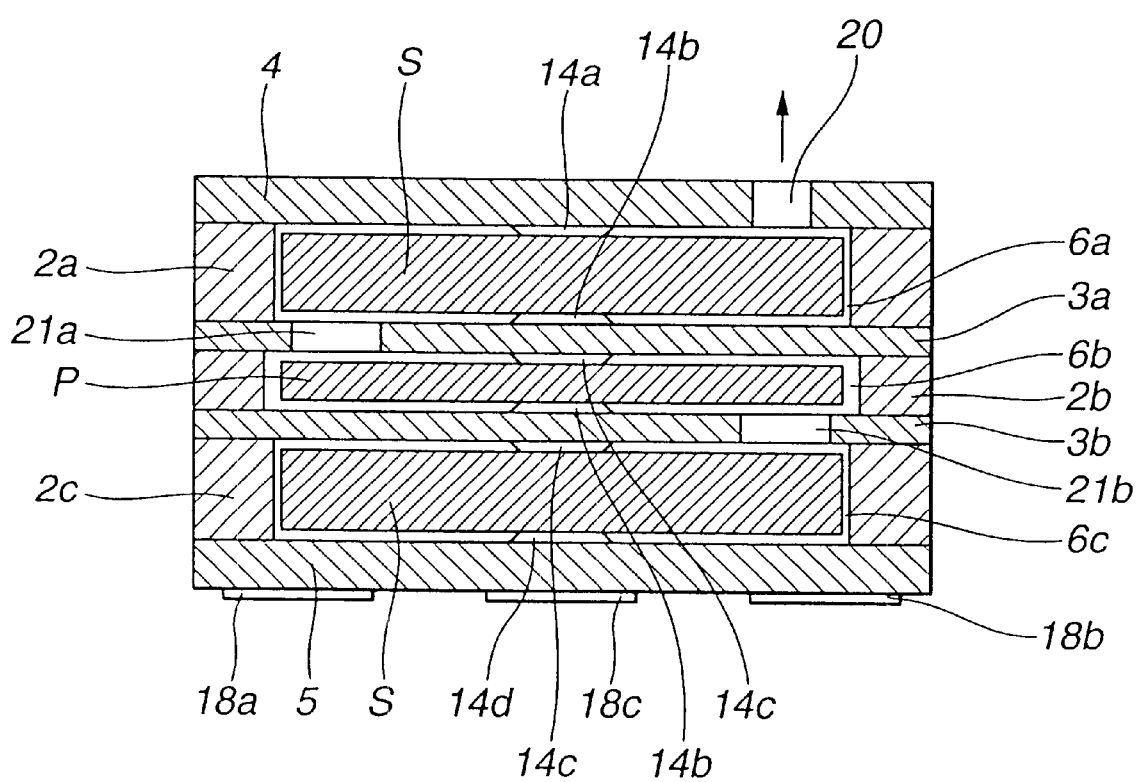
FIG. 3 is a sectional view of the multilayer type piezoelectric filter of FIG. 1.

As shown in FIG. 3, the top printed circuit board 4 has at the lower surface thereof a conductive pattern including a circular land portion 14a. The conductive pattern is connected with one of the conductive grooves at the edge of the top printed circuit board 4. The conductive land portion 14a is connected to the central portion of the electrode on the upper surface of the series resonator S.

Figure 4A:
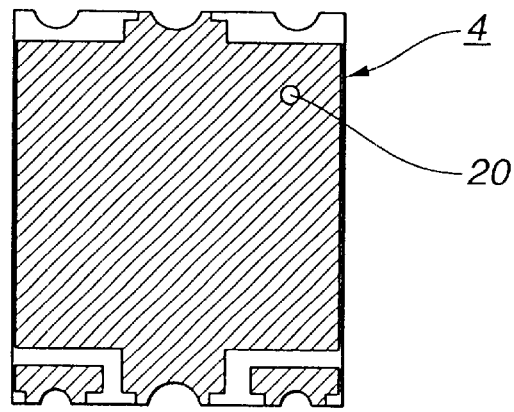
FIGS. 4A to 4C are top plan views showing a top printed circuit board, an intermediate printed circuit board and a bottom printed circuit board, respectively.
Figure 4B:
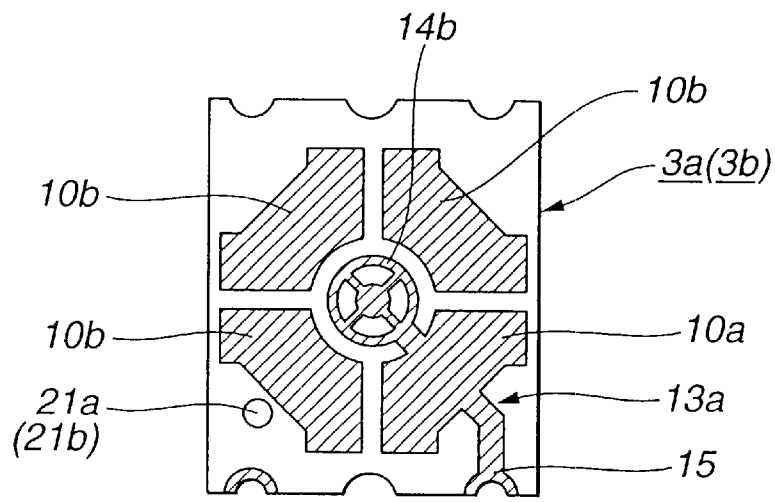
Figure 4C:
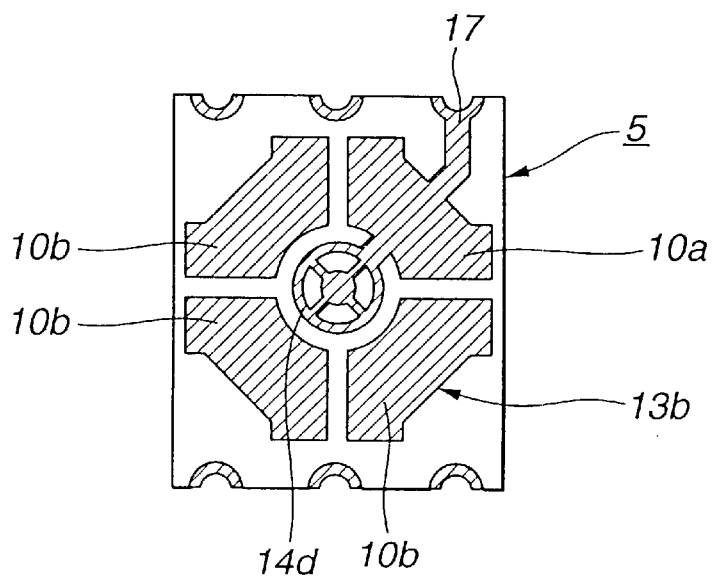

As shown in FIG. 4B, each of the intermediate printed circuit boards 3a and 3b has at the upper surface thereof a conductive pattern 13a including four separate conductive surfaces 10a, 10b, 10b and 10b. In the conductive pattern 13a, one conductive surface 10a is effective or actually operable and other three conductive surfaces 10b, 10b and 10b are dummy electrodes. At the center of the conductive pattern 13a is formed a circular conductive land portion 14b which is connected by way of the effective conductive surface 10a to a conductive edge 15 constituting part of the arcuate conductive groove of the intermediate printed circuit boards 3a and 3b. Further, on the lower surface of each of the intermediate printed circuit boards 3a and 3b is formed a similar circular conductive land portion 14c (refer to FIG. 3). The conductive land portion 14b on the upper surface of the intermediate printed circuit board 3a is connected to the central portion of the electrode on the lower surface of the series resonator S (refer to FIG. 4A). The conductive land potion 14c on the lower surface of the intermediate printed circuit board 3a is connected to the central portion of the electrode on the upper surface of the parallel resonator P. Similarly, the conductive land portion 14b on the upper surface of the intermediate printed circuit board 3b is connected to the central portion of the electrode on the lower surface of the parallel resonator P. The conductive land portion 14c on the lower surface of the intermediate printed circuit board 3b is connected to the central portion of the electrode on the upper surface of the series resonator S.

The bottom printed circuit board 5 has on the upper surface thereof a conductive pattern 13b including four separate conductive surface portions 10a, 10b, 10b and 10b and a circular conductive land portion 14d. The conductive pattern 13b is connected to a conductive edge 17 constituting one of the arcuate conductive grooves of the bottom printed circuit board 5. As shown in FIG. 3, on the lower surface of the bottom printed circuit board 5 are provided an input electrode 18a and an output electrode 18b which are located adjacent the corners on the front edge side and a grounding electrode pad 18c which is located adjacent the center of the rear edge. The electrodes are connected to the respective conductive patterns 13a and 13b by way of the conductive paths 12. In the above described structure, by forming four separate conductive surfaces 10a, 10b, 10b and 10b including dummy electrodes on the surface of each of the intermediate printed circuit boards 13a and 13b and the bottom printed circuit board 5, each printed circuit board can be uniform in the mechanical strength around the circular conductive land portion 14b or 14d. Thus, the multilayer type piezoelectric filter has an advantage of being capable of attaining an improved mechanical strength.

The multilayer type piezoelectric filter F has such an S-P-S structure as described above. In case of mounting the piezoelectric filter F on a printed circuit board, i.e., in case the electrodes 18a, 18b and 18c on the lower surface of the piezoelectric filter F are connected by reflow soldering to corresponding portions of a printed circuit board, the piezoelectric filter F is exposed to heat of a high temperature. Further, the frame-like spacers 2a, 2b and 2c, the intermediate printed circuit boards 3a and 3b, the top printed circuit board 4 and the bottom printed circuit board 5 are joined together by heating of the adhesive sheets. To this end, the piezoelectric filter F is also placed within an atmosphere of a high temperature.

The frame-like spacers 2a, 2b and 2c, the intermediate printed circuit boards 3a and 3b, the printed circuit board 4 and the bottom printed circuit board 5 are all made of glass epoxy and may be sized, by way of example, such that the intermediate printed circuit boards 3a and 3b are 0.1 mm thick and the top printed circuit board 4 and the bottom printed circuit board 5 are 0.2 m thick. Such a multilayer type piezoelectric filter F is quite thin, i.e., the total thickness thereof is 1.8 mm. Further, the dimensions of the external shape is 6.5 mm long and 5.5 mm wide. The above described dimensions are shown for the purpose of illustration only and not for the purpose of limitation.

The multilayer type piezoelectric filter F structured as described above is simple in structure, i.e., has a simple laminated structure and can be thin. Further, since the resonators S and P are protected by a casing consisting of the frame-like spacers 2a, 2b and 2c, the top printed circuit board 4 and the bottom printed circuit board 5, the piezoelectric filter F is strong and durable while enabling the resonators S and P to be protected mechanically and electrically. Furthermore, the piezoelectric filter F can be produced by simply laminating the plate-like components and the adhesive sheets and heating them. Thus, the piezoelectric filter F can be produced with ease and is therefore suited for mass production.

Then, an important portion of the multilayer type piezoelectric filter F according to an embodiment of the present invention will be described.

A feature of the present invention resides in that the top printed circuit board 4 and the intermediate printed circuit boards 3a and 3b are formed with air vents or communication holes 20, 21a and 21b, respectively. The communication hole 20 provides commutation between the chamber 6a and the outside or atmosphere. The communication hole 21a provides communication between the chambers 6a and 6b. The communication hole 21b provides communication between the chambers 6b and 6c. By the communication holes 20, 21a and 21b, the pressure within the chambers 6a, 6b and 6c is prevented from becoming too high when the piezoelectric filter F is exposed to heat of a high temperature for electrically and mechanically connecting the electrode pads 18a, 18b and 18c to a printed circuit board by reflow soldering or when heated to a high temperature for bonding the frame-like spacers 2a, 2b and 2c, the intermediate printed circuit boards 3a and 3b, the top printed circuit board 4 and the bottom printed circuit board 5 together by means of the adhesive sheets.

In this instance, the communication hole 20 formed in the top printed circuit board 4 is formed so as to be smaller in diameter than the communication holes 21a and 21b. In this embodiment, the communication hole 20 is 0.3 mm in diameter and the communication holes 21a and 21b are 0.5 mm in diameter. In this connection, the diameter of the communication hole 20 is not limited to 0.3 mm but can range from 0.1 mm to 0.4 mm. Further, the diameter of the communication holes 21a and 21b is not limited to 0.5 mm but can be 0.4 mm or larger. Further, the communication hole 21a formed in the upper, intermediate printed circuit board 3a can be smaller in diameter than the communication hole 21b formed in the lower, intermediate printed circuit board 3b so that higher one of the communication holes 20, 21a and 21b has a smaller diameter.

Further, the communication holes 20 and 21a are disposed at one and the other of opposite sides of the piezoelectric filter F so as to be distant or separate as much as possible. Similarly, the communication holes 21b and 21a are respectively disposed at one and the other of the opposite sides so as to be distant or separate as much as possible. Namely, the communication holes 20, 21a and 21b are disposed alternately at one and the other of the opposite sides as shown in FIG. 3. More preferably, the communication holes 20 and 21a are respectively disposed at one and the other of diagonally opposite corners of the piezoelectric filter F so as to be distant or separate as much as possible. Similarly, the communication holes 21b and 21a are respectively disposed at one and the other of the diagonally opposite corners so as to be distant or separate as much as possible. Namely, the communication holes 20, 21a and 21b are disposed alternately at one and the other of the diagonally opposite corners as shown in FIG. 2.

In such a structure, the top printed circuit board 4 and the intermediate printed circuit boards 3a and 3b are respectively formed with the communication holes 20, 21a and 21b, thus allowing the chambers 6a, 6b and 6c to be communicated with the outside or the atmosphere. Accordingly, even when the piezoelectric filter F is heated up to a high temperature, substantial or excessive increase of the internal pressure is not caused and therefore it never occurs deformation of the outer casing, i.e., it never occurs that the top and bottom printed circuit boards 4 and 5 are curved or rounded outward. Further, with such a structure, the bottom printed circuit board 5 is not formed with any communication hole. By this, it never occurs that solder flows into the piezoelectric filter F through the communication hole.

On the other hand, when the filter F is cooled down to a normal temperature after the air inside the piezoelectric filter F is discharged due to heat of a high temperature, the air containing moisture of the atmosphere may flow into the piezoelectric filter F, thus causing a possibility that the characteristics of the piezoelectric filter F are deteriorated and the conductive layers are shorted. Accordingly, it is desired that discharge of air inside the piezoelectric filter F due to heat of a high temperature is restricted so long as a variation of the internal pressure does not cause the top and bottom printed circuit board 4 and 5 to be curved or rounded outward.

Accordingly, since the communication hole 20 formed in the top printed circuit board 4 is smaller in diameter than the communication holes 21a and 21b formed in the intermediate printed circuit boards 3a and 3b, the air inside the chambers 6c and 6b is caused to flow out therefrom relatively with ease since the components of the piezoelectric filter F are heated to a high temperature in the order from a lower component to a higher component. A temperature rise of the chamber 6a located at an uppermost position is relatively smaller. Thus, by the communication hole 20 which is formed in the top printed circuit board 4 so as to communicate directly with the atmosphere and have a relatively smaller diameter, the air has a difficulty of flowing out due to the flow resistance so that the air inside the piezoelectric filter F generally has a difficulty of flowing out of the same.

Further, in FIG. 3, the communication holes 20, 21a and 21b are disposed alternately on the right-hand side and the left-hand side and spaced apart from each other along a side surface as much as possible. Thus, within each chamber, air flows from one side edge to the other side edge, i.e., flows zigzag. During such zigzag flow, the heat of air is absorbed by the respective components of the piezoelectric filter F, thus causing a temperature fall of the air. Further, since the air flows along a path which is designed as long as possible, the flow resistance is increased due to increase of the resistance of the surrounding or associated components and occurrence of a turbulent flow. By this increase of the flow resistance, the amount of air flowing out of the piezoelectric filter F is reduced. For this reason, when the piezoelectric filter F held within an atmosphere of a high temperature is moved therefrom and held within an atmosphere of a normal temperature, flow of the air into the chambers 6a, 6b and 6c is prevented or restricted.

From the foregoing, it will be understood that in the multilayer type piezoelectric filter F, it never occurs that the outer casing made up of the top printed circuit board 4, the bottom printed circuit board 5, etc. is deformed or transformed when the piezoelectric filter F is placed within an atmosphere of a high temperature. Furthermore, even when the piezoelectric filter F held within an atmosphere of a high temperature is moved therefrom and held within an atmosphere of a normal temperature, flow of the open air into the piezoelectric filter F is restricted, thus making it possible to prevent, as much as possible, the moisture contained in the air from flowing into the piezoelectric filter F to wet the inside of same.

In this manner, in the multilayer type piezoelectric filter F of this invention, the internal pressure in the respective chambers 6a, 6b and 6c is adjusted optimally. Thus, an influence of heat due to reflow soldering or an influence of cooling on the piezoelectric filter F is prevented or restricted. Namely, in cooperation with the particular structure of the multilayer type piezoelectric filter F, it becomes possible to adjust the internal pressure optimally.

Although the invention has been described above by reference to a certain embodiment of the invention, the invention is not limited to the embodiment described above. Modifications and variations of the embodiment described above will occur to those skilled in the art, in light of the above teachings. For example, while the multilayer type piezoelectric filter F of the S-P-S structure, i.e., of the three-storied structure has been described and shown, it can be of the P-S-P structure or it can be of the two-storied structure or of the four-storied or more structure. Further, the bottom printed circuit board 5 may be formed with a communication hole for providing communication between the chamber 6c and the outside. However, when this is the case, it is desired that the communication hole is formed sufficiently small in diameter so as not to cause the solder to flow therethrough into the chamber 6c or the communication hole is formed at a place sufficiently separated or distant from the electrode pads 18a, 18b and 18c. The scope of the invention is defined with reference to the following claims.

What is claimed is:

1. A multilayer type piezoelectric filter comprising:
   at least two laminated resonators;
   at least two frame-like spacers surrounding the resonators, respectively;
   at least one intermediate printed circuit board interposed between the resonators and between the frame-like spacers;
   a top printed circuit board disposed on the resonators and the frame-like spacers to cooperate with one of the frame-like spacers and the intermediate printed circuit board to define therebetween a first chamber within which one of the resonators is disposed;
   a bottom printed circuit board disposed under the resonators and the frame-like spacers to cooperate with the other of the frame-like spacers and the intermediate printed circuit board to define therebetween a second chamber within which the other of the resonators is disposed;
   a plurality of electrode pads formed on a lower surface of the bottom printed circuit board;
   a first communication hole formed in the intermediate printed circuit board for providing air communication between the first chamber and the second chamber; and
   a second communication hole formed in the top printed circuit board for providing communication between the first chamber and the outside.

2. A multilayer type piezoelectric filter according to claim 1, wherein the second communication hole is smaller in diameter than the first communication hole.

3. A multilayer type piezoelectric filter according to claim 1, being generally rectangular when observed in plan, wherein the first communication hole is disposed adjacent one of opposite sides of the piezoelectric filter and the second communication hole is disposed adjacent the other of the opposite sides when observed in plan.

4. A multilayer type piezoelectric filter according to claim 1, being generally rectangular when observed in plan, and wherein the first communication hole is disposed adjacent one of diagonally opposite corners of the piezoelectric filter and the second communication hole is disposed adjacent the other of the diagonally opposite corners when observed in plan.

5. A multilayer type piezoelectric filter according to claim 1, wherein the frame-like spacers, the top printed circuit board and the bottom printed circuit board are bonded together and hermetically sealed at joining portions thereof.

6. A multilayer type piezoelectric filter comprising:
   a plurality of resonators laminated one upon the other;
   a plurality of frame-like spacers surrounding the resonators, respectively;
   a plurality of intermediate printed circuit boards interposed between adjacent two of the resonators and between adjacent two of the frame-like spacers;
   a top printed circuit board disposed on the resonators and the frame-like spacers to cooperate with associated one of the frame-like spacers and associated one of the intermediate printed circuit boards to define therebetween a first chamber;
   the intermediate printed circuit boards cooperating with the frame-like spacers to define therebetween at least one second chamber;
   a bottom printed circuit board disposed under the resonators and the frame-like spacers to cooperate with associated one of the frame-like spacers and associated one of the intermediate printed circuit boards to define therebetween a third chamber;

the resonators being disposed within the first chamber, the second chamber and the third chamber, respectively;

the frame-like spacers, the top printed circuit board and the bottom printed circuit board being bonded together and hermetically sealed at joining portions thereof;

a plurality of electrode pads formed on a lower surface of the bottom printed circuit board;

a plurality of first vents formed in the intermediate printed circuit boards for providing air communication between the first chamber and the second chamber and between the second chamber and the third chamber; and a second vent formed in the top printed circuit board for providing communication between the first chamber and the outside.

7. A multilayer type piezoelectric filter according to claim 6, wherein one of the first vents formed in upper one of the intermediate printed circuit boards is smaller in diameter than another of the first vents formed in lower one of the intermediate printed circuit boards.

8. A multilayer type piezoelectric filter according to claim 7, wherein the second vent is smaller in diameter than one of the first vents formed in upper one of the intermediate printed circuit boards.

9. A multilayer type piezoelectric filter according to claim 6, being generally rectangular when observed in plan, wherein one of the first vents formed in the upper one of the intermediate printed circuit boards is located adjacent one of diagonally opposite corners of the piezoelectric filter, and another of the first vents formed in lower one of the intermediate printed circuit boards and the second vent are located adjacent the other of the diagonally opposite corners when observed in plan.

10. A multilayer type piezoelectric filter according to claim 6, wherein the number of the resonators is three, one of the resonators is a parallel resonator and the other two are series resonators to constitute a filter circuit of an S-P-S structure.

11. A multilayer type piezoelectric filter according to claim 6, wherein the number of the resonators is three, one of the resonators is a series resonator and the other two are parallel resonators to constitute a filter circuit of an P-S-P structure.

12. A multilayer type piezoelectric filter according to claim 6, wherein the first vents are 0.4 mm or larger in diameter, and the second vent ranges in diameter from 0.1 mm to 0.4 mm.

\* \* \* \* \*